United States Patent
Tsai et al.

(10) Patent No.: US 9,929,056 B1
(45) Date of Patent: Mar. 27, 2018

(54) METHOD FOR FORMING GATE STRUCTURES IN DIFFERENT OPERATION VOLTAGES

(71) Applicant: United Microelectronics Corp., Hsinchu (TW)

(72) Inventors: Te-Chiu Tsai, New Taipei (TW); Shih-Yin Hsiao, Chiayi County (TW); Ching-Wei Teng, Taoyuan (TW); Tun-Jen Cheng, Hsinchu (TW); Hung-Yi Tsai, Taipei (TW); Shan-Shi Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/359,389

(22) Filed: Nov. 22, 2016

(51) Int. Cl.
| | |
|---|---|
| *H01L 21/3205* | (2006.01) |
| *H01L 21/8234* | (2006.01) |
| *H01L 21/28* | (2006.01) |
| *H01L 21/02* | (2006.01) |
| *H01L 21/027* | (2006.01) |

(52) U.S. Cl.
CPC .. *H01L 21/823462* (2013.01); *H01L 21/0274* (2013.01); *H01L 21/02323* (2013.01); *H01L 21/28008* (2013.01); *H01L 21/823456* (2013.01)

(58) Field of Classification Search
None
See application file for complete search history.

(56) References Cited

U.S. PATENT DOCUMENTS

| | | | |
|---|---|---|---|
| 6,087,237 A | 7/2000 | Hwang | |
| 8,994,082 B2 * | 3/2015 | Hung | H01L 21/26506 257/288 |
| 9,349,815 B2 | 5/2016 | Tseng et al. | |
| 2004/0183106 A1 | 9/2004 | Kim et al. | |
| 2006/0138571 A1 * | 6/2006 | Ahn | H01L 21/28202 257/411 |
| 2017/0179145 A1 * | 6/2017 | Chee | H01L 27/11573 |

OTHER PUBLICATIONS

Shih-Yin Hsiao, et al., "Gate Oxide Structure and Method for Fabricating the Same," Unpublished U.S. Appl. No. 15/292,775, filed Oct. 13, 2016, The specification, claims, and the drawings of the unpublished pending U.S. application have been stored in the Image File Wrapper (IFW) system.

* cited by examiner

*Primary Examiner* — Bradley K Smith
(74) *Attorney, Agent, or Firm* — J.C. Patents

(57) ABSTRACT

A method for forming gate structures for a HV device and a MV device is provided. The method includes forming a HV oxide layer on the substrate, covering a first region predetermined for forming the HV device. Further in the method, a dielectric mask is formed on a central portion of the HV oxide layer. A thermal oxidation process is performed to form a MV oxide layer on the substrate at a second region predetermined for forming the MV device, wherein peripheral portions of the HV oxide layer not covered by the dielectric mask grow thicker. The dielectric mask is removed. A conductive layer is formed over the substrate. The conductive layer, the HV oxide layer, the MV oxide layer are patterned to form the gate structures.

16 Claims, 8 Drawing Sheets

METHOD FOR FORMING GATE STRUCTURES IN DIFFERENT OPERATION VOLTAGES

BACKGROUND

1. Field of the Invention

The present invention generally relates to semiconductor fabrication, in particular, to the methods for fabricating gate structures for a high-voltage (HV) device and a medium-voltage (MV) device, or even a low-voltage (LV) device.

2. Description of Related Art

As the development in circuit design to adapt various electronic parts with various function operated in different operation voltage levels, such as HV level, MV level, and LV level, the integrated circuit would include the HV circuit, the MV circuit and the LV circuit. The HV circuit would include various HV devices, which are operated at the HV level, such as about 100 volts. Likewise, the MV circuit would include various MV devices, which are operated at the MV level, such as few tens volts. The LV circuit would include various LV devices, which are operated at a voltage, usually less than 10 volts. As a result, in an example, the integrated circuit has the capabilities to respectively drive the HV apparatus, the MV apparatus and the LV apparatus.

The metal-oxide-semiconductor (MOS) transistor is the basic device to form the integrated circuit. Taking the MOS transistors as the examples, the HV circuit would include a certain number of HV MOS transistors, the MV circuit would include a certain number of MV MOS transistors, and the LV circuit would include a certain number of LV MOS transistors. However in the semiconductor fabrication technology, the HV devices, the MV devices and the LV devices need to be fabricated as an integrated circuit based on the same substrate.

Certainly, the HV device needs to endure an operation voltage at the HV level, so a gate oxide layer for the HV MOS transistor should be thick enough without causing leaking voltage. Likewise, the MV device needs to endure an operation voltage at the MV level, so a gate oxide layer for the MV MOS transistor would be still thick but thinner than the gate oxide layer of the HV transistor. Even further, the LV device needs to endure an operation voltage at the LV level, so a gate oxide layer for the LV MOS transistor would be thinner than the gate oxide layer of the MV transistor.

Since the HV transistor is operated at HV level, the leakage current at the periphery of the gate oxide layer is an issue to be really concerned. Even further in fabrication point of view, how to fabricate the HV device and the MV device, and even the LV device at the same time without adding too many extra processes is the issue in the art to further develop.

SUMMARY OF THE INVENTION

The invention is directed to methods for fabricating gate structures for the HV device and the MV device, in which the LV device can also be fabricated.

In an embodiment, the invention provides a method for forming gate structures for a HV device and a MV device. The method includes forming a HV oxide layer on the substrate, covering a first region predetermined for forming the HV device. Further in the method, a dielectric mask is formed on a central portion of the HV oxide layer. A thermal oxidation process is performed to form a MV oxide layer on the substrate at a second region predetermined for forming the MV device, wherein peripheral portions of the HV oxide layer not covered by the dielectric mask grow thicker. The dielectric mask is removed. A conductive layer is formed over the substrate. The conductive layer, the HV oxide layer, the MV oxide layer are patterned to form the gate structures.

As to an embodiment in the above method, a ratio of a width of each of the peripheral portions of the HV oxide layer to a width of the gate structure of the HV device is in a range of 1/18 to 3/18.

As to an embodiment in the above method, the widths of the peripheral portions are substantially equal.

As to an embodiment in the above method, the step of performing the thermal oxidation process is using the dielectric mask as a mask to grow oxide.

As to an embodiment in the above method, the dielectric mask is nitride.

As to an embodiment in the above method, the step of performing the thermal oxidation process forms a concave structure for the HV oxide layer at the first region.

The invention also provides a method for forming gate structures for a HV device at a first region of a substrate, a MV device at a second region of the substrate, and a LV device at a third region of the substrate. The method includes forming a HV oxide layer on the substrate at the first region. Further, a dielectric mask layer is formed having a first mask portion on the substrate at the third region and a second mask portion on a central part of the HV oxide layer at the first region. A thermal oxidation process is performed to form a MV oxide layer on the substrate at the second region, wherein peripheral portions of the HV oxide layer not covered by the second mask portion grows thicker. The dielectric mask layer is removed. A LV oxide layer is formed over the substrate, covering the first region, the second region and the third region. A conductive layer is formed on the LV oxide layer. The conductive layer, the HV oxide layer, the MV oxide layer and the LV oxide layer are patterned to respectively form the gate structures.

As to an embodiment in the above method, a ratio of a width of each of the peripheral portions of the HV oxide layer to a width of the gate structure of HV device is in a range of 1/18 to 3/18.

As to an embodiment in the above method, the widths of the peripheral portions are substantially equal.

As to an embodiment in the above method, the step of performing the thermal oxidation process is using the dielectric mask layer as a mask to grow oxide at the second region.

As to an embodiment in the above method, the dielectric mask layer is nitride.

As to an embodiment in the above method, the step of performing the thermal oxidation process forms a concave structure for the HV oxide layer at the first region.

The invention also provides a method for forming gate structures for a HV device at a first region of a substrate, a MV device at a second region of the substrate, and a LV device at a third region of the substrate. The method includes forming a HV oxide layer on the substrate at the first region. Further, a MV oxide layer is formed over the substrate at the first region, the second region and the third region. The MV oxide layer is patterned to remove a portion of the MV oxide layer at the third region and at the central area of the first region on the HV oxide layer. A LV oxide layer is formed over the substrate at the first region, the second region and the third region. A conductive layer is formed on the LV oxide layer. The conductive layer, the HV oxide layer, the MV oxide layer and the LV oxide layer are patterned to form the gate structures.

As to an embodiment in the above method, a ratio of a width of each of the peripheral portions of the HV oxide layer to a width of the gate structure of HV device is in a range of 1/18 to 3/18.

As to an embodiment in the above method, the widths of the peripheral portions are substantially equal.

As to an embodiment in the above method, after the step of patterning the MV oxide layer, a residual portion of the MV oxide layer on the HV oxide layer adds a thickness of the HV oxide layer at peripheral portions.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
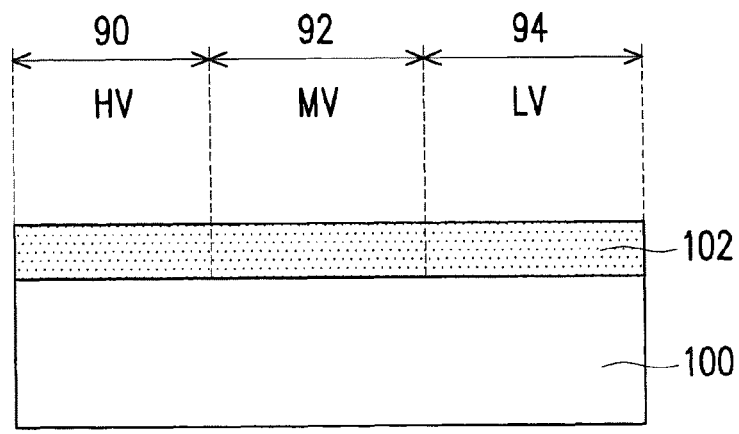
FIG. 1A to FIG. 1H are cross-sectional views, schematically illustrating the fabrication process flow for forming gate structures for a HV device, a MV device and a LV device on the substrate, according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Several embodiments are provided for describing the invention but the invention is not limited to the embodiments as provided. Further, any proper combination between the embodiments can be allowed to form another embodiment.

The invention can fabricate gate structures for the HV device and the MV device and even the LV device together, in which the HV device can have better structure of the gate oxide layer to effectively reduce the gate leakage.

FIG. 1A to FIG. 1H are cross-sectional views, schematically illustrating the fabrication process flow for forming gate structures for a HV device, a MV device and a LV device on the substrate, according to an embodiment of the invention.

Referring to FIG. 1A, to fabricated the HV devices, the MV device and the LV device in the integrated circuit, the substrate 100 has been divided into HV region 90, MV region 92, and LV region 94, in which several HV devices, MV devices, and LV devices are respectively formed. The HV devices would include the HV MOS transistors with HV gate structures. Likewise, the MV devices would include MV MOS transistors with MV gate structures. The LV devices would include the LV MOS transistors with LV gate structures. To fabricate the HV gate structures, the MV gate structure, and the LV gate structure in the same procedure, the invention proposes the method, first forming an oxide layer 102 over the substrate 100, covering the HV region 90, the MV region 92 and the LV region 94. The HV region 90 is for forming the HV devices, the MV region 92 is for forming the MV devices, and the LV region 94 is for forming the LV devices. The oxide layer 102 has a sufficient thickness to resist the high voltage operation and at least avoid the current leakage.

Figure 1B:
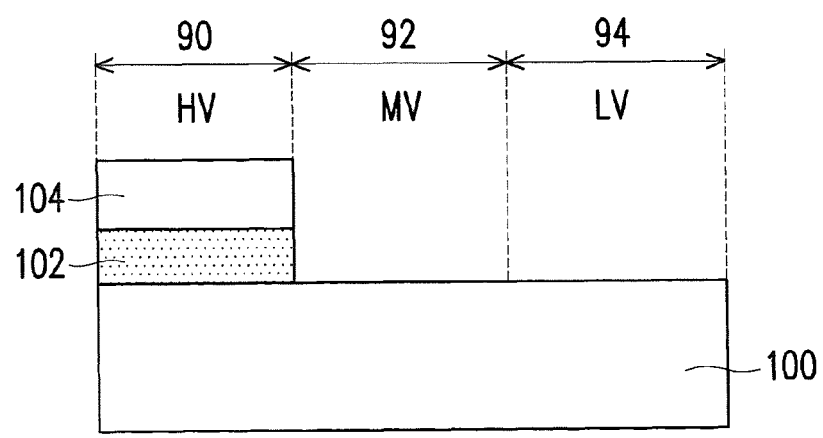
Figure 1C:
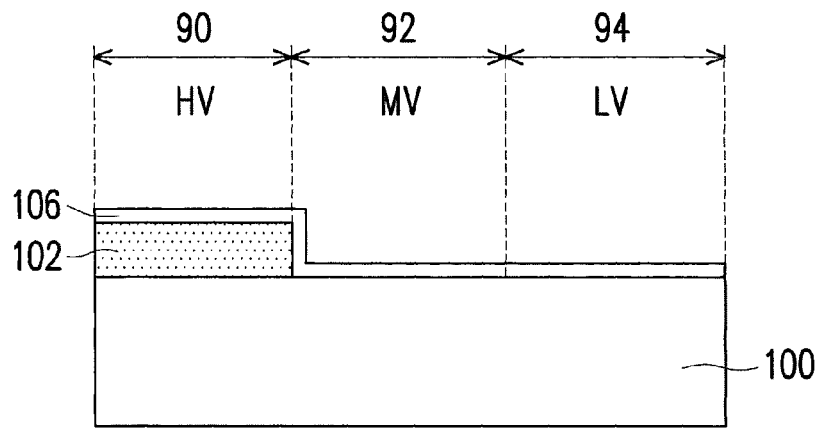

Referring to FIG. 1B, the oxide layer 102 is patterned by photolithographic and etching process, in which the photoresist layer 104 is formed on the oxide layer 102 as the etching mask. As a result, a remaining portion of the oxide layer 102 is just formed in the HV region 90. At this stage, the oxide layer 102 in the HV region 90 has a uniform thickness. In order to improve the capability to resist current leakage at HV, further structure which is the protruding part at the periphery of the gate oxide layer as to be seen later needs to be formed on the oxide layer 102.

After FIG. 1B, a MV oxide layer is to be formed on the substrate 100 in the MV region 92. Then, referring to FIG. 1C, a hard dielectric layer 106, such as nitride layer, is formed over the substrate 100, in which the oxide layer 102 is also covered by the hard dielectric layer 106 on top.

Figure 1D:
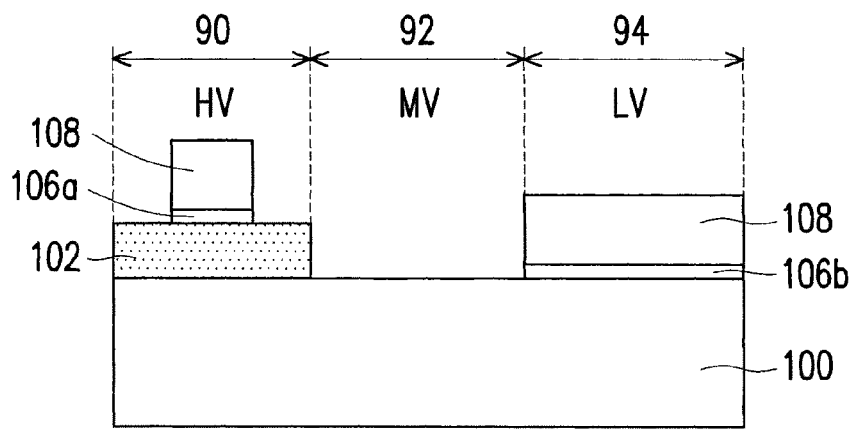

Referring to FIG. 1D, the hard dielectric layer 106 is patterned by photolithographic and etching processes, in which the photoresist layer 108 is used as the etching mask. The remaining portion of the hard dielectric layer 106 has two parts. One part of hard dielectric layer 106 is on the oxide layer 102 to serve as a dielectric mask 106a, which can be a strip mask as an example. Another part of hard dielectric layer 106 is on the substrate 100 in the LV region 94 to serve another dielectric mask 106b. As noted, the dielectric mask 106a in an example is a strip along the middle region of the gate oxide layer 102, so the peripheral region of the gate oxide layer 102 are exposed without being covered by the dielectric mask 106a.

Figure 1E:
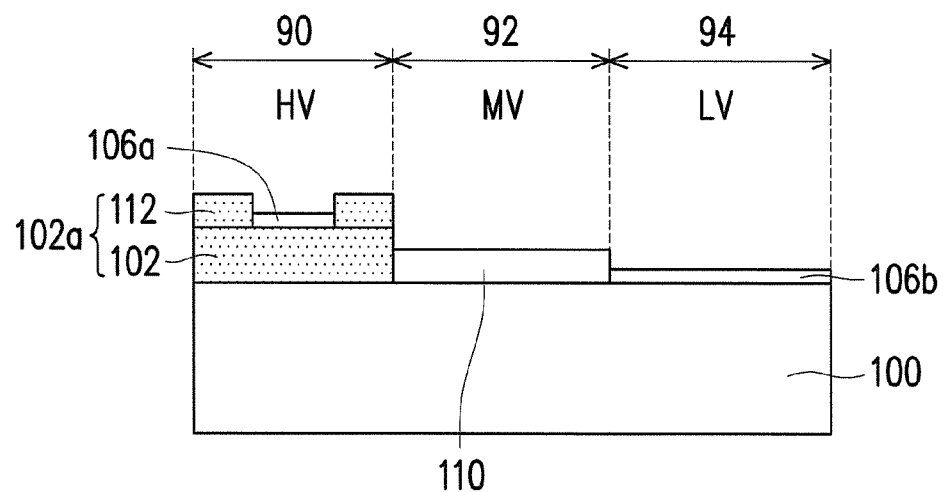

Referring to FIG. 1E, after removing the photoresist layer 108, the dielectric mask 106a and the dielectric mask 106b serves as the mask, a thermal oxidation process can be performed to form the MV gate oxide layer 110 on the substrate 100 at the exposed surface in the MV region 92.

It should be noted in FIG. 1E that the dielectric mask 106a only covers the middle region of the gate oxide layer 102, so that a portion on the gate oxide layer 102 not covered by the dielectric mask 106a can also grow a little more as the protruding layer 112 during the thermal oxidation process for forming the MV gate oxide layer 110. Then, the gate oxide layer 102 and the protruding layer 112 form together as the HV gate oxide layer 102a, which is thicker at the both sides in the peripheral region. Here, the LV region 94 is masked by the dielectric mask 106b, so no oxide at the LV region 94 is significantly formed.

Figure 1F:
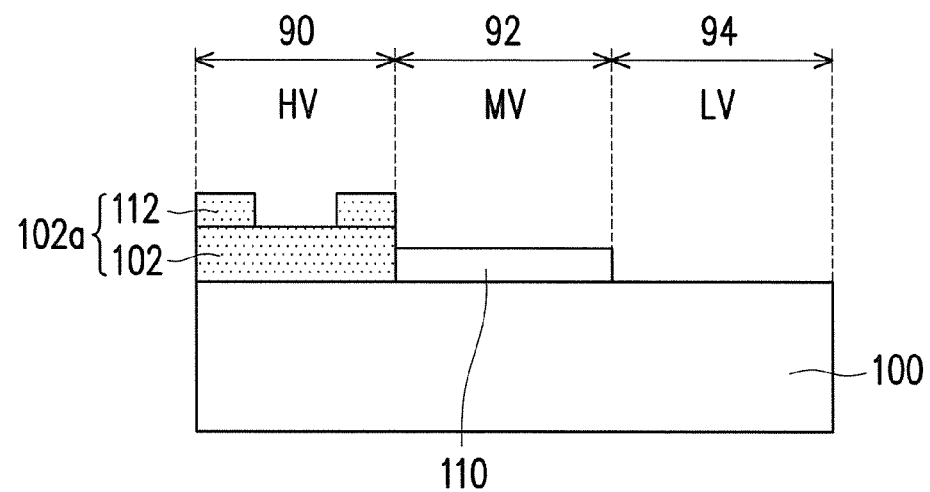

Referring to FIG. 1F, the dielectric mask 106a and the dielectric mask 106b are removed, in which the substrate 100 in the LV region 94 is exposed in this step. As a result, the HV gate oxide layer 102a has the protruding layer 112 at peripheral region, so a concave structure is forming in another point of view. So far, the HV gate oxide layer 102a and the MV gate oxide layer 110 have been formed. It can be also noted that if the integrated circuit does not include LV operation, the LV device is then not needed and then the LV gate oxide in the LV region 94 is not necessary to be formed. However, in the embodiment, the LV device is presented in the integrated circuit. So the additional process for forming the LV gate oxide layer is described. However, if the LV device is not included, the formation of LV gate oxide layer can be omitted.

Figure 1G:
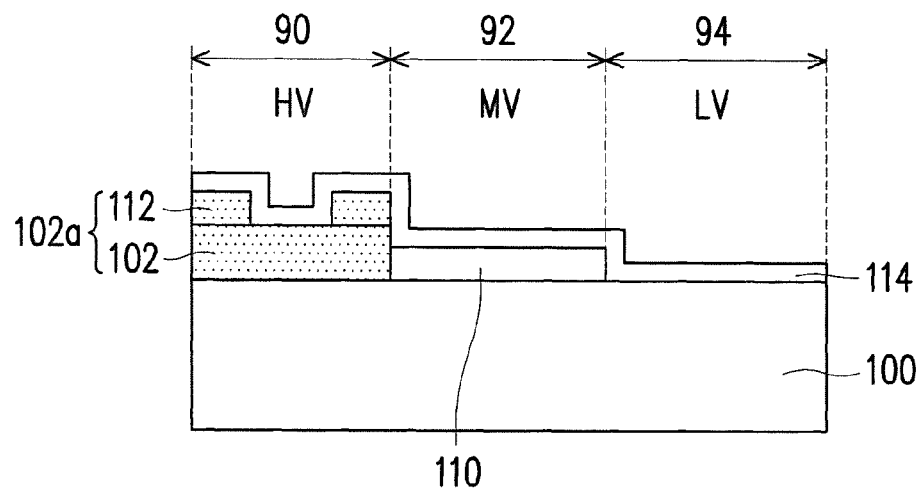

Referring to FIG. 1G, an oxide layer 114 is forming over the substrate. The oxide layer 114 is basically used to form the LV gate oxide layer, so the thickness of the oxide layer 114 can be thinner as usual. As previously stated, if the LV device is not included, the oxide layer 114 can be omitted.

Figure 1H:
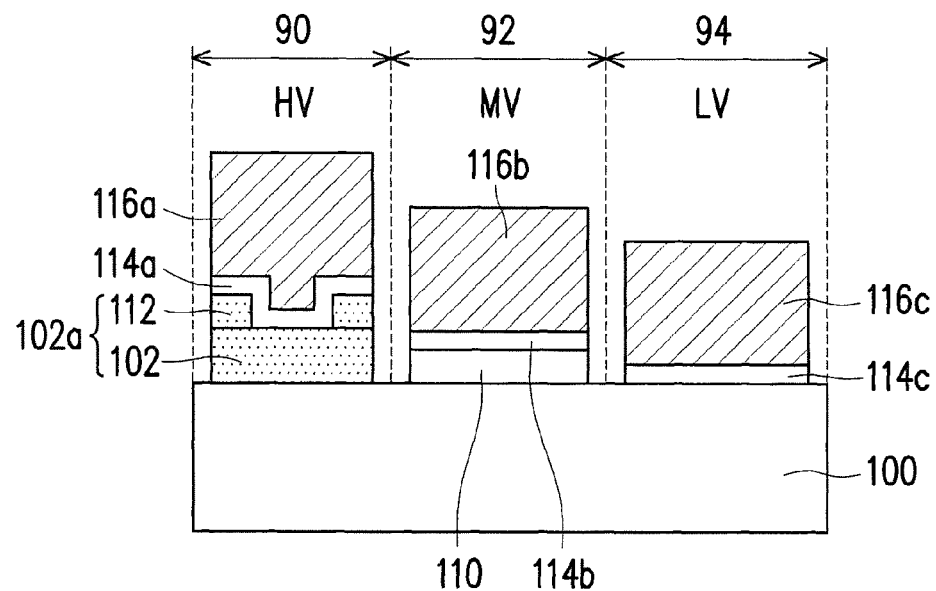

Referring to FIG. 1H, to form the HV gate structure, the MV gate structure, and the LV gate structure, a conductive layer as to be formed into gate layers 116a, 116b, 116c later is formed on the oxide layer 114. Again, if the oxide layer 114 is omitted, then the conductive layer can directly cover on the HV gate oxide layer 102a and the MV gate oxide layer 110. Also noted in the example, the conductive layer may be a single polysilicon layer or a stacked structure of composited layers, depending on the actual design. In other words, the conductive layer can be a single layer or a composite layer stacked by multiples layers or any other which can be formed for gate structure.

The conductive layer, the HV gate oxide layer 102a, the MV gate oxide layer 110, and even further the oxide layer 114 are patterned to form the HV gate structure in the HV region 90, the MV gate structure in the MV region 92, and the LV gate structure in the LV region 94. The remaining portion of the conductive layer is divided into the HV gate layer 116a, the MV gate layer 116b and the LV gate layer 116c. As noted, each gate layer can be a single layer or a composite layer stacked by multiples layers or any other which can be formed for gate structure.

Figure 3:
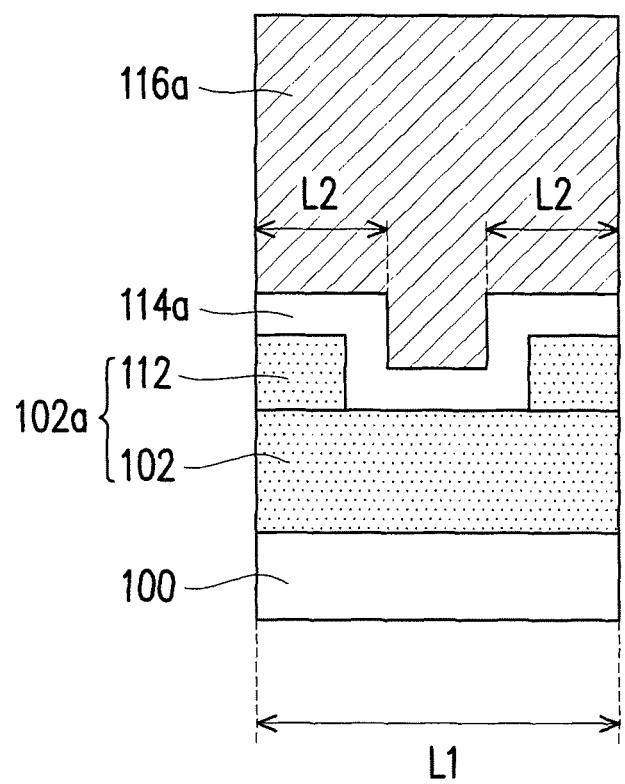
FIG. 3 is a drawing, schematically illustrating the HV gate structure, according to an embodiment of the invention.

The HV gate structure as also illustrated in FIG. 3 has the protruding layer 112 and can at least effectively reduce the current leakage of the HV gate structure to endure the HV operation.

It can be noted that, the similar structure for the HV gate structure can be formed by another fabrication procedure as to be described in following descriptions.

FIG. 2A to FIG. 2F are cross-sectional views, schematically illustrating the fabrication process flow for forming gate structures for a HV device, a MV device and a LV device on the substrate, according to an embodiment of the invention.

Figure 2A:
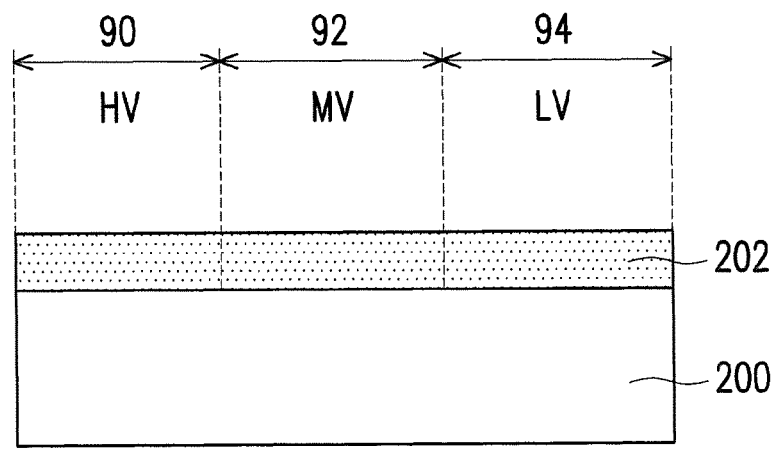
FIG. 2A to FIG. 2F are cross-sectional views, schematically illustrating the fabrication process flow for forming gate structures for a HV device, a MV device and a LV device on the substrate, according to an embodiment of the invention.

Referring to FIG. 2A, an oxide layer 202 like the oxide layer in FIG. 1A is formed on the substrate 200. The oxide layer 202 is later to be used as the HV gate oxide layer, so the oxide layer 202 has sufficient thickness as expected for the HV device in the HV region 90.

Figure 2B:
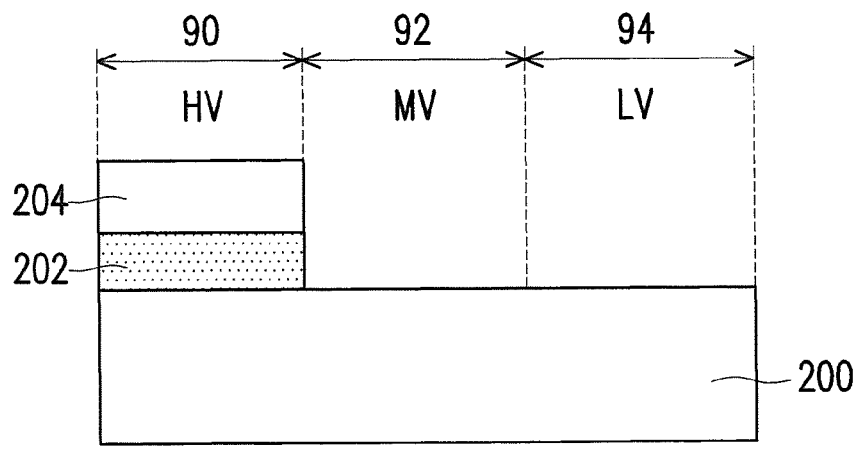

Referring to FIG. 2B, the oxide layer 202 is patterned by photolithographic and etching processes, in which the photoresist layer 204 is used as the etching mask to reserve the portion of the oxide layer 202 in the HV region 90.

Figure 2C:
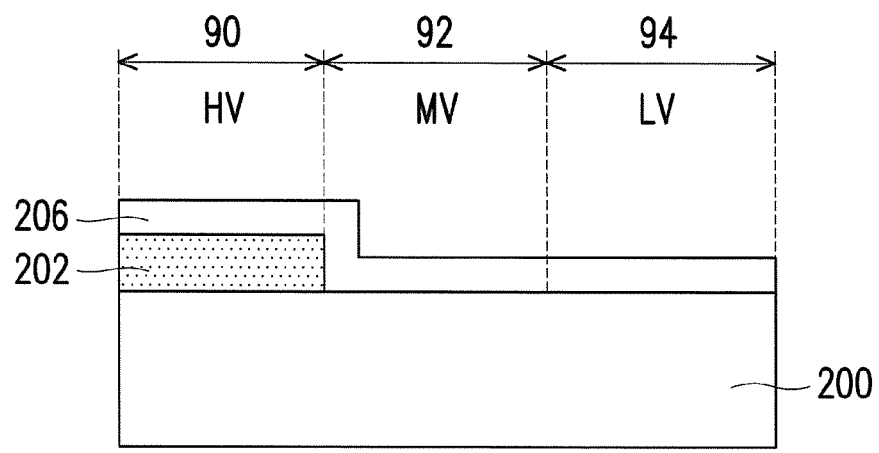

Referring to FIG. 2C, after removing the photoresist layer 204, an oxide layer 206 is formed over the substrate 200. A portion of the oxide layer 206 is to be serving as the MV gate oxide layer for the MV device in the MV region 92, so the thickness of the oxide layer 206 is at the range for the MV device.

Figure 2D:
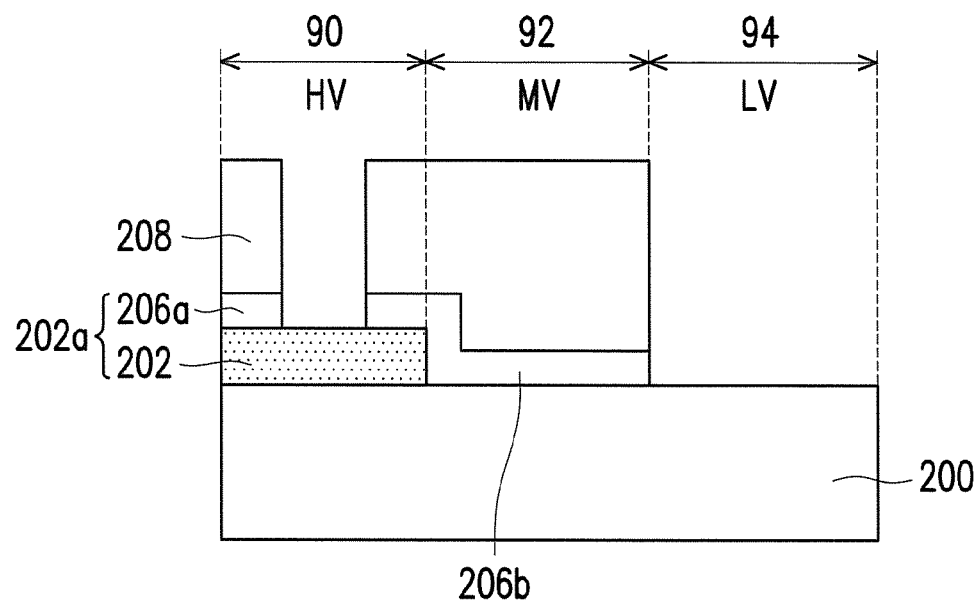

Referring to FIG. 2D, the oxide layer 206 is then patterned by photolithographic and etching processes, in which the photoresist layer 208 is used as the etching mask to reserve a portion of the oxide layer 206 in the MV region, as indicated as the MV oxide layer 206b. Another portion of the oxide layer 206 on top of the oxide layer 202 is reserved and is indicated as the protruding layer 206a.

However, the middle region of the oxide layer 202 in the HV region 90 is exposed by the photoresist layer 208. The protruding layer 206a is similar to the protruding layer 112 in FIG. 1F but in different process. The protruding layer 206a covers the top of the oxide layer 202 at both sides in the peripheral region. As a result, the protruding layer 206a and the oxide layer 202 form together as the HV gate oxide layer 202a.

Figure 2E:
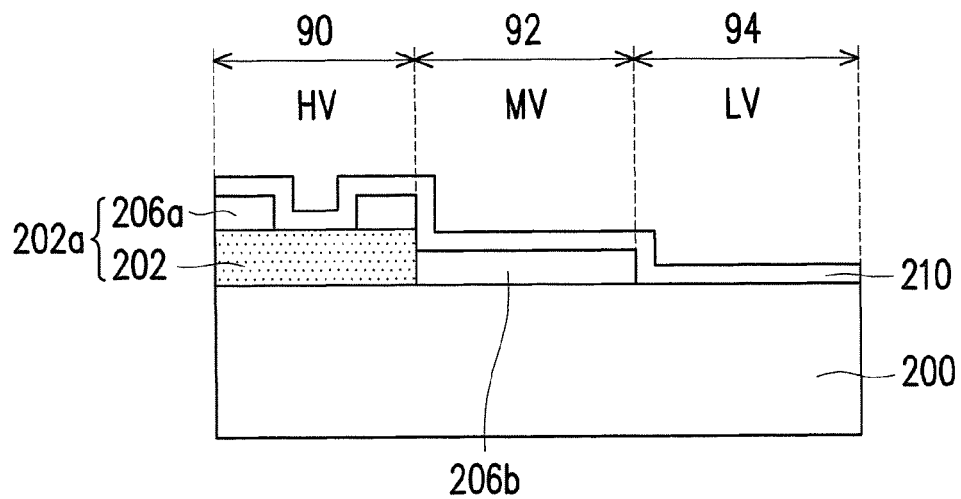

Referring to FIG. 2E, another oxide layer 210 is formed over the substrate 200. The oxide layer 210 is to be serving as the LV gate oxide layer later for the LV device in the LV region 94, so the thickness is thinner.

Figure 2F:
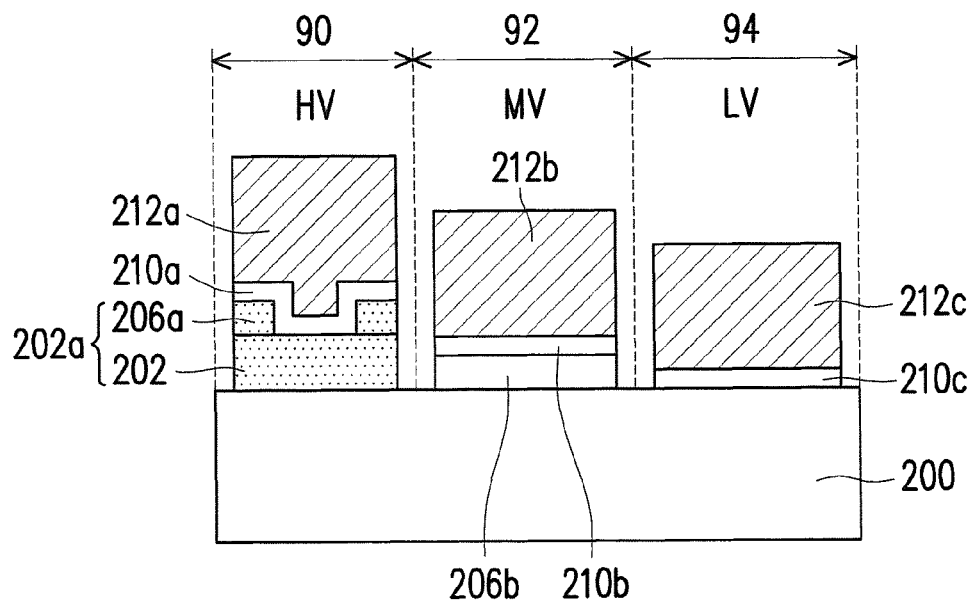

Referring to FIG. 2F, similar to FIG. 1H, a conductive layer is formed on the oxide layer 210. The conductive layer can be a single layer or a composite layer stacked by multiple sub layers as previously stated in FIG. 1H. Then, after patterning the conductive layer, the oxide layer 206a, 206b and the oxide layer 210, the HV gate structure is formed in the HV region 90, the MV gate structure is formed in the MV region 92, and the LV gate structure is formed in the LV region 94. The oxide layer 210 is divided into the HV portion 210a, the MV portion 210b and the LV portion 210c, respectively in the HV region, the MV region, and the LV region. The conductive layer is divided into the HV gate layer 212a, the MV gate layer 212b and the LV gate layer 212c, respectively in the HV region, the MV region, and the LV region.

A ratio of the width of the protruding layer 112, 206a to the width of the HV gate structure may be set to a proper range in an embodiment. Taking the HV gate structure in FIG. 1H as an example, FIG. 3 is a drawing, schematically illustrating the HV gate structure, according to an embodiment of the invention. Referring to FIG. 3, the width of the protruding layer 112 is indicated as L2 while the width of the HV gate structure is indicated as L1. So, the ratio of L2/L1 can be in a range of 1/18 to 3/18, in which the ratio of 1.5/18 could be better. However, the invention is not necessary to be limited to the embodiment. The protruding layer 112, 206a is to adding thickness to the gate oxide layer and the peripheral region. In addition, widths of the two protruding layers 112, 206a at both sides of the gate structure may be substantially equal but not the required limitation.

The invention has proposed the method to easily fabricate the HV gate structure and the MV gate structure, and even the LV gate structure, if needed, without significantly adding extra process to form the protruding layer for the HV gate structure. In other words, the protruding layer 112, 206 can be formed together with the MV gate oxide layer 110, 206b and the protruding layer 112, 206 can effectively improve the quality of the HV gate oxide layer 102a, 202a.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming gate structures for a high-voltage (HV) device and a medium-voltage (MV) device, the method comprising:

forming a HV oxide layer on the substrate, covering a first region predetermined for forming the HV device;

forming a dielectric mask on a middle portion of the HV oxide layer, wherein peripheral portions of the HV oxide layer are exposed;

performing a thermal oxidation process to form a MV oxide layer on the substrate at a second region predetermined for forming the MV device, wherein a peripheral oxide layer is also formed on the peripheral portions of the HV oxide layer by the thermal oxidation process without including implantation;

removing the dielectric mask;
forming a conductive layer over the substrate; and
patterning the conductive layer, the HV oxide layer, the MV oxide layer and to form the gate structures.

2. The method of claim 1, wherein a ratio of a width of each of the peripheral portions of the HV oxide layer to a width of the gate structure of the HV device is in a range of 1/18 to 3/18.

3. The method of claim 2, wherein the widths of the peripheral portions are substantially equal.

4. The method of claim 1, wherein the step of performing the thermal oxidation process is using the dielectric mask as a mask to grow oxide.

5. The method of claim 4, wherein the dielectric mask is nitride.

6. The method of claim 1, wherein the step of performing the thermal oxidation process forms a concave structure for the HV oxide layer at the first region.

7. A method for forming gate structures for a high-voltage (HV) device at a first region of a substrate, a medium-voltage (MV) device at a second region of the substrate, and a low-voltage (LV) device at a third region of the substrate, the method comprising:
    forming a HV oxide layer on the substrate at the first region;
    forming a dielectric mask layer, having a first mask portion on the substrate at the third region and a second mask portion on a middle part of the HV oxide layer at the first region, wherein peripheral portions of the HV oxide layer are exposed;
    performing a thermal oxidation process to form a MV oxide layer on the substrate at the second region, wherein a peripheral oxide layer is also formed on the peripheral portions of the HV oxide layer by the thermal oxidation process without including implantation;
    removing the dielectric mask layer; and
    forming a LV oxide layer over the substrate, covering the first region, the second region and the third region;
    forming a conductive layer on the LV oxide layer; and
    patterning the conductive layer, the HV oxide layer, the MV oxide layer and the LV oxide layer to respectively form the gate structures.

8. The method of claim 7, wherein a ratio of a width of each of the peripheral portions of the HV oxide layer to a width of the gate structure of HV device is in a range of 1/18 to 3/18.

9. The method of claim 8, wherein the widths of the peripheral portions are substantially equal.

10. The method of claim 7, wherein the step of performing the thermal oxidation process is using the dielectric mask layer as a mask to grow oxide at the second region.

11. The method of claim 10, wherein the dielectric mask layer is nitride.

12. The method of claim 7, wherein the step of performing the thermal oxidation process forms a concave structure for the HV oxide layer at the first region.

13. A method for forming gate structures for a high-voltage (HV) device at a first region of a substrate, a medium-voltage (MV) device at a second region of the substrate, and a low-voltage (LV) device at a third region of the substrate, the method comprising:
    forming a HV oxide layer on the substrate at the first region;
    forming a MV oxide layer over the substrate at the first region, the second region and the third region;
    patterning the MV oxide layer to remove a portion of the MV oxide layer at the third region and at a central area at the first region on the HV oxide layer, wherein a thickness of the HV oxide layer remains same and peripheral portions of the HV oxide layer are covered by the MV oxide layer; and
    forming a LV oxide layer over the substrate at the first region, the second region and the third region;
    forming a conductive layer on the LV oxide layer; and
    patterning the conductive layer, the HV oxide layer, the MV oxide layer and the LV oxide layer to form the gate structures.

14. The method of claim 13, wherein a ratio of a width of each of the peripheral portions of the HV oxide layer to a width of the gate structure of HV device is in a range of 1/18 to 3/18.

15. The method of claim 14, wherein the widths of the peripheral portions are substantially equal.

16. The method of claim 13, wherein after the step of patterning the MV oxide layer, a residual portion of the MV oxide layer on the HV oxide layer adds a thickness of the HV oxide layer at peripheral portions.

* * * * *